United States Patent [19]
Blodgett

[11] Patent Number: 5,801,982
[45] Date of Patent: Sep. 1, 1998

[54] TEMPERATURE SENSITIVE OSCILLATOR CIRCUIT

[75] Inventor: Greg A. Blodgett, Nampa, Id.

[73] Assignee: Micron Technology, Inc., Boise, Id.

[21] Appl. No.: 790,539

[22] Filed: Jan. 30, 1997

Related U.S. Application Data

[62] Division of Ser. No. 710,490, Sep. 18, 1996, which is a division of Ser. No. 504,939, Jul. 20, 1995, which is a continuation-in-part of Ser. No. 275,576, Jul. 15, 1994, Pat. No. 5,455,801.

[51] Int. Cl.$^6$ .................................................. G11C 7/00
[52] U.S. Cl. ............................ 365/149; 365/222; 331/66
[58] Field of Search .................................... 365/149, 222, 365/194, 211, 212; 331/66, 70, 176

[56] References Cited

U.S. PATENT DOCUMENTS

| | | | |
|---|---|---|---|
| 4,393,477 | 7/1983 | Murotani | 365/222 |
| 4,716,551 | 12/1987 | Inagaki | 365/222 |
| 5,278,796 | 1/1994 | Tillinghast et al. | 365/222 |
| 5,428,319 | 6/1995 | Marvin et al. | 331/66 |
| 5,459,436 | 10/1995 | Pucci et al. | 331/66 |
| 5,495,452 | 2/1996 | Cha | 365/222 |
| 5,499,214 | 3/1996 | Mori et al. | 365/222 |
| 5,544,120 | 8/1996 | Kuwagata et al. | 331/66 |

Primary Examiner—Tan T. Nguyen
Attorney, Agent, or Firm—Schwegman, Lundberg, Woessner & Kluth, P.A.

[57] ABSTRACT

A temperature sensitive oscillator circuit and control circuit which together form a current source. The temperature sensitive oscillator circuit generates an output signal which controls a frequency of a refresh oscillator circuit. The duty cycle of the output signal of the temperature sensitive oscillator circuit is temperature dependent and increases for increases in temperature. The output signal of the temperature sensitive oscillator circuit controls the control circuit which sources current between the refresh oscillator circuit and a supply node. As the duty cycle of the output signal of the temperature sensitive oscillator circuit increases a time duration during which the control circuit sources current between the refresh oscillator circuit and the supply node increases. This increase increases the frequency of the output signal of the refresh oscillator circuit. The output signal of the refresh oscillator circuit is an internal clock signal which controls a refresh cycle of a memory circuit.

14 Claims, 6 Drawing Sheets

TEMPERATURE SENSITIVE OSCILLATOR CIRCUIT

This application is a divisional of application Ser. No. 08/710,490 filed Sept. 18, 1996, which is a divisional application of application Ser. No. 08/504,939, filed Jul. 20, 1995, which is a continuation in part of Greg A. Blodgett's U.S. Patent entitled A CIRCUIT HAVING A CONTROL MEMORY ARRAY OF MEMORY CELLS AND A CURRENT SOURCE AND A METHOD FOR GENERATING A SELF-REFRESH TIMING SIGNAL, Ser. No. 275,576 filed on Jul. 15, 1994 and having U.S. Pat. No. 5,455,801.

FIELD OF THE INVENTION

The invention relates to self-refreshing dynamic random access memories (DRAMs), and more particularly to circuits on the DRAM for generating self-refresh timing signals for determining the period of the refresh cycle and for generating the self-refresh mode signal.

BACKGROUND OF THE INVENTION

A self-refreshing DRAM is a dynamic random access memory which has an autonomous refresh circuit.

DRAMs are comprised of a plurality of memory storage cells in which each cell consists of a transistor and an intrinsic capacitor. The transistors are used to charge and discharge the capacitors to certain voltage levels. The capacitors then store the voltages as binary bits, 1 or 0, representative of the voltage levels. The binary 1 is referred to as a "high" and the binary 0 is referred to as a "low." The voltage value of the information stored in the capacitor of a memory cell is called the logic state of the memory cell. Due to capacitance leakage, the memory storage cells must be refreshed periodically during a refresh mode to keep the capacitors charged or discharged to ensure memory preservation. A refresh cycle normally involves cycling through the memory and performing a read/write operation in each row of the memory, in turn. A sleep mode is typically characterized as a low power mode having no active read or write operations during which data retention is desired. It is typically necessary to refresh each row of memory in the DRAM device within a time period of 4 to 256 milliseconds for data retention.

In order for refresh to occur, an external row address strobe signal* (RAS*) and an internally generated self-refresh timing signal must typically be active. When RAS* transitions to an inactive state, the refresh mode is typically exited. Automatic exiting of the refresh mode without regard to the state of the internally generated self-refresh timing signal may cause metastability of the DRAM due to glitches caused by external RAS* and the internal self-refresh timing signal opposing one another.

Thus there exists a need to prevent glitches from occurring during a termination of a self-refresh mode when a race condition exists between an external RAS* transitioning to an inactive state and an internally generated self-refresh timing signal transitioning to an active state.

There is also a need to vary the period of the refresh cycle and the period of the refresh mode to adjust the rate of refresh for changes in voltage and temperature. Changes in voltage and temperature may vary the rate of leakage of the memory storage cells requiring more or less frequent refreshing of the DRAM.

SUMMARY OF THE INVENTION

The invention is a temperature sensitive oscillator circuit and a control circuit which together form a current source. The temperature sensitive oscillator circuit generates an output signal which controls a frequency of a refresh oscillator circuit. The duty cycle of the output signal of the temperature sensitive oscillator circuit is temperature dependent and increases for increases in temperature. The output signal of the temperature sensitive oscillator circuit controls the control circuit which sources current between the refresh oscillator circuit and a supply node. As the duty cycle of the output signal of the temperature sensitive oscillator circuit increases a time duration during which the control circuit sources current between the refresh oscillator circuit and the supply node increases. This increase increases the frequency of the output signal of the refresh oscillator circuit. The output signal of the refresh oscillator circuit is an internal clock signal which controls a refresh cycle of a memory circuit, typically a dynamic random access memory (DRAM) device.

DETAILED DESCRIPTION OF THE INVENTION

The invention is a self-refreshing dynamic random access memory (DRAM) device having a plurality of memory storage cells for storing electronic data. The memory storage cells leak charge and must be refreshed. In one embodiment the invention is an oscillator circuit of the self-refreshing DRAM. The oscillator circuit of the invention generates an internal clock signal. A counter counts the pulses of the internal clock signal and generates a self-refresh mode signal for initiating the self-refresh mode in the DRAM device and generates a self-refresh cycle signal for initiating each self-refresh cycle during the self-refresh mode.

Figure 1:
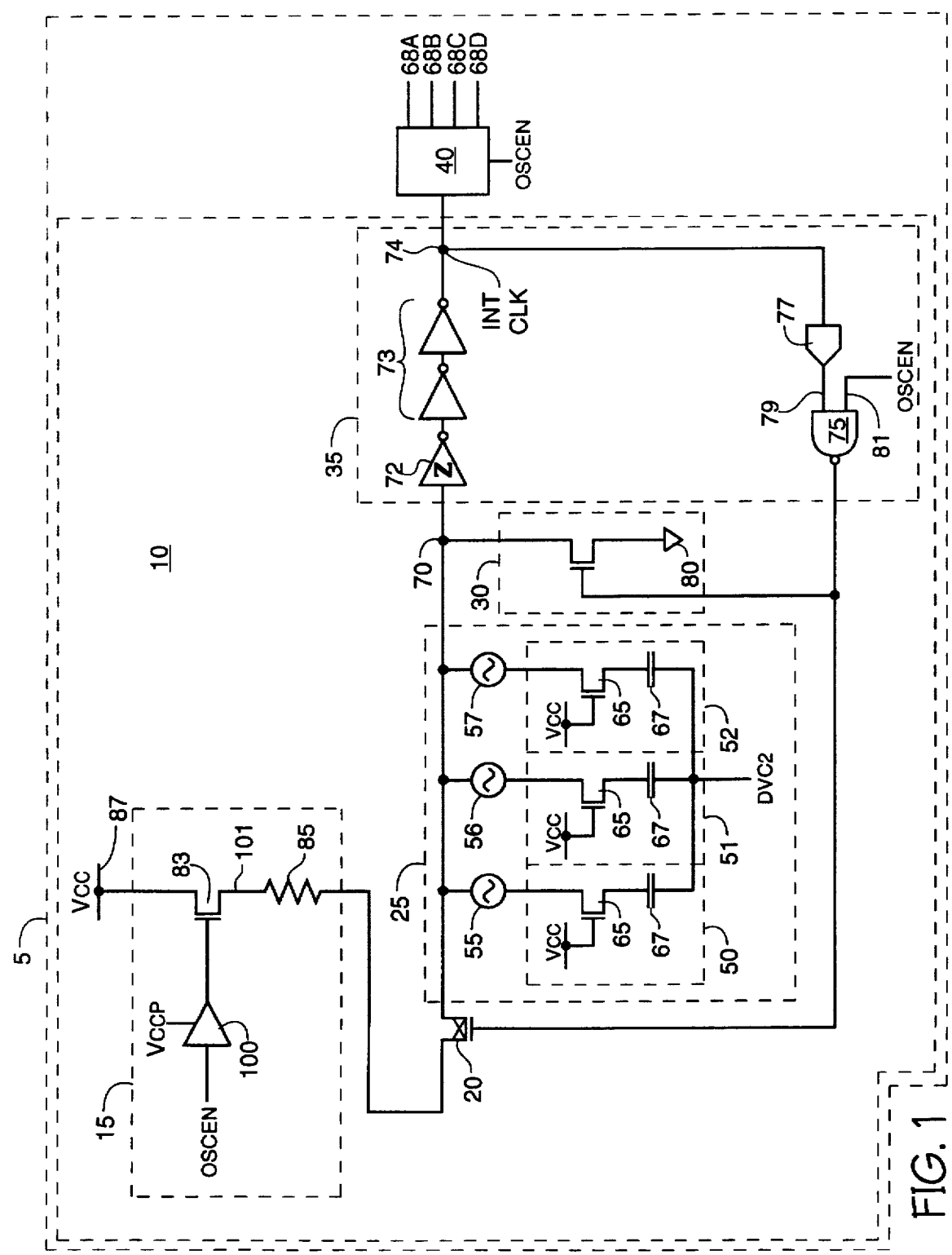
FIG. 1 is a schematic of an oscillator circuit.

FIG. 1 is a schematic of a DRAM device 5 having the oscillator circuit 10 of the invention. The oscillator circuit 10 functions as a timing circuit and generates at least one self-refresh timing signal. The oscillator circuit 10 comprises a current source 15, a switching device 20, a capacitor portion 25, a discharge circuit 30, and a monitor circuit 35. The DRAM device 5 also has a counter 40 for counting the internal clock signal generated by the oscillator circuit.

The capacitor portion 25 is charged to a potential by current source 15 when switching device 20 is actuated. The monitor circuit 35 monitors the potential of node 70. Node 70 is driven to a potential equal to the potential stored in capacitor portion 25. The monitor circuit 35 signals the discharge device 30 and switching device 20 when the potential reaches a desired value and provides an internal clock signal to the counter 40.

The capacitor portion 25 comprises three control arrays 50–52. Although each control array 50–52 is represented by only one control cell in the figure, each control array 50–52 actually comprises a plurality of control cells. In this embodiment there are 36 control cells in each control array 50–52. Although the exact number of control cells may vary it is advisable to use a sufficient number of control cells to ensure that an average cell of the control arrays 50–52 is representative of an average memory storage cell of the self-refreshing DRAM. The control cells are fabricated to have the same structure and size as the memory storage cells of the DRAM, although larger geometries may be used to ensure manufacturability. Using identical fabrication during array fabrication ensures that control arrays 50–52 and the memory storage arrays of the DRAM react identically to changes in temperature and voltage. Each control cell is a continually actuated transistor 65 connected serially to a storage capacitor 67.

Each control array 50–52 can be electrically isolated from the circuit by opening a fuse 55–57, respectively. Electrically isolating a control array increases the frequency of the self-refresh timing signal.

The potential on node 70 is inverted in schmitt trigger 72 and is buffered in inverters 73 to generate the internal clock signal at node 74. The schmitt trigger has a high trip point and a low trip point. When the potential at node 70 reaches the high trip point the output of the schmitt trigger is inverted from its input potential on node 70 after a time delay internal to the schmitt trigger. The output of the schmitt trigger does not transition again until the potential at node 70 decreases to the low trip point of the schmitt trigger. Node 74 is the clock input node to counter 40. The internal clock signal represents the inverse of the potential of capacitors 67 when they are charged and discharged. The internal clock signal has a period. The counter circuit 40 counts the number of periods of the internal clock signal and generates an active self-refresh mode signal at node 68A and generates self-refresh cycle signals at nodes 68B–D.

The first active self-refresh timing signal following the enablement of the 15 oscillator circuit 10 is a self-refresh mode signal for initiating self-refresh in the DRAM device 5. The self-refresh mode signal is driven to node 68A. The self-refresh timing signals following the self-refresh mode signal are self-refresh cycle signals. The self-refresh cycle signals are driven to nodes 68B–D. The DRAM 5 is refreshed in response to the self-refresh cycle signal until the self-refresh mode is exited.

The internal clock signal at node 74 is also fedback to NAND gate 75 through delay circuit 77. The NAND gate 75 output signal controls the charge and discharge of the capacitor portion 25. When the potential on node 70 reaches the high trip point of the schmitt trigger 72, node 74 goes low after a time delay. The low on node 74 is further delayed through delay circuit 77 and takes the output of NAND gate 75 to a high potential. The high potential deactuates p-channel transistor 20 and actuates the n-channel transistor of discharge circuit 30 discharging the capacitor portion 25 through the transistor of discharge circuit 30. When the potential of node 70 reaches the low trip point of the schmitt trigger 72, the output of the schmitt trigger 72 transitions to a high potential, and the potential of node 74 transitions to a high which is delayed in delay circuit 77. The high potential fed back to NAND input node 79 causes the output of the NAND gate 75 to go low when the oscillator enable signal on input node 81 is high. The low NAND gate 75 output signal actuates transistor 20 coupling current source 15 to the capacitor portion 25 and deactuates the transistor of discharge circuit 30 isolating the capacitor portion 25 from the ground potential at reference node 80. The capacitor portion 25 now begins to recharge to a high potential through actuated transistor 20.

The current source 15 comprises an n-channel transistor 83 for sourcing current between the capacitor portion 25 and a supply potential ($V_{cc}$, typically equal to potential lying between 5 Volts and 3 volts), connected at node 87, during the charging of the capacitor portion 25 and comprises a resistor 85 for controlling the amount of current sourced. An oscillator enable signal (OSCEN), generated in response to external signals, is driven to the gate of transistor 83 through a level translating buffer circuit 100 to control the activation and deactivation of n-channel transistor 83. The level translating buffer circuit 100 buffers a potential to the gate of transistor 83 which is large enough to pull the potential of node 101 to the full $V_{cc}$ potential at node 87 when transistor 83 is actuated.

Figure 2:
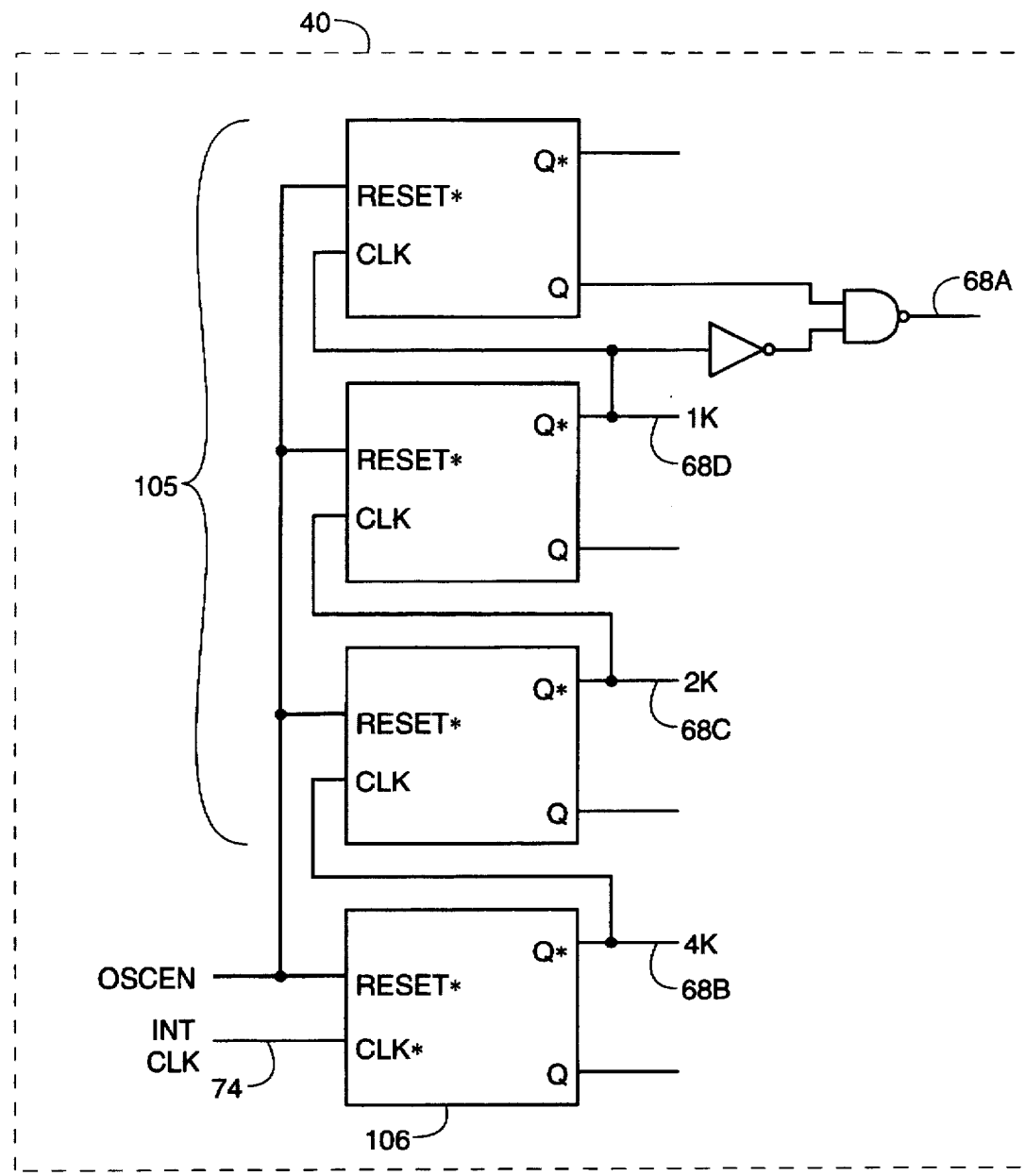
FIG. 2 is a detailed schematic of a counter circuit.

Counters are well known in the art. FIG. 2 is one possible counter circuit which may be used for counter 40 in the DRAM of the invention. Like components in FIGS. 1 and 2 are numbered the same. The counter 40 comprises 3 positive edge triggered flip-flops 105 and a negative edge triggered flip flop 106. The frequency of the monitor signal at node 74 is approximately 75 KHz with all three fuses 55–57 electrically conductive. The counter 40 provides the self-refresh mode signal at node 68A after 24 periods of the internal clock signal. The self-refresh mode has a timeout approximately equal to 300 micro seconds. The counter also provides self-refresh cycle signals at nodes 68B, 68C, and 68D having frequencies of 18.75 KHz, 9.4 KHz and 4.7 KHz for generating row address strobe(RAS)* pulses for 4K, 2K or 1K refresh parts, respectively. This corresponds to a refresh rate of 200 milliseconds.

Figure 3:
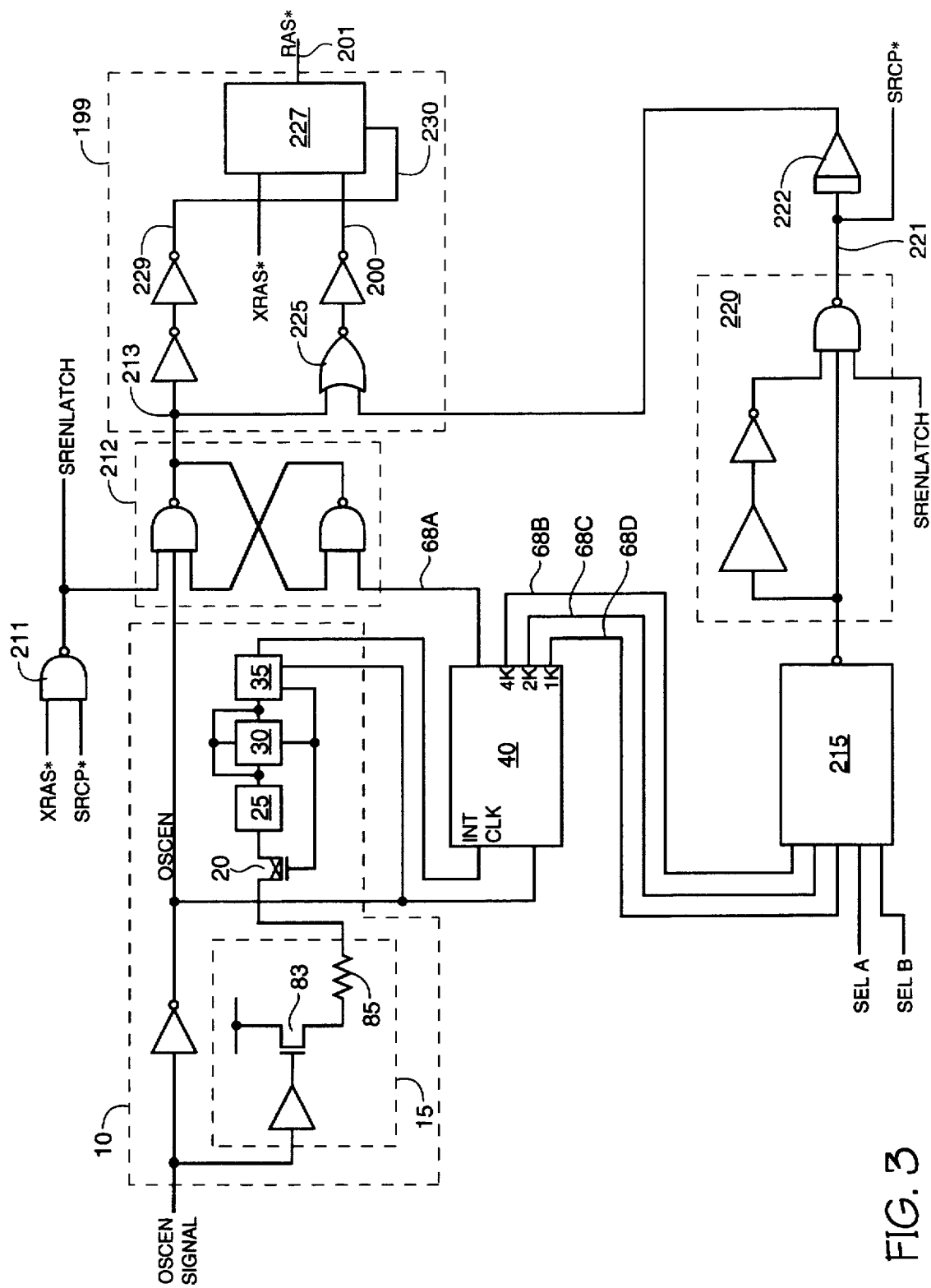
FIG. 3 is a schematic of a portion of a dynamic random access memory device.

In FIG. 3 a further embodiment of the invention is shown. Like components in FIGS. 1 and 3 are numbered the same. The oscillator enable signal, generated in response to a CAS before RAS (CBR), is buffered to current source 15 where it controls the activation and deactivation of transistor 83. (CAS is column address strobe.) The oscillator enable signal is also inverted to the input of the monitor circuit 35 and to an input of the counter circuit 40.

The self-refresh mode signal at output node 68A of counter 40 is designed to enable an output circuit portion 199 to drive a self-refresh cycle pulse* (SRCP*) signal from node 200 to an output node 201. A NAND gate 211 is used to lock out an inactive external RAS* (XRAS*) occurring during the generation of an active SRCP* so that glitches do not occur during exit from the self-refresh mode. A latch 212 is used to latch the active self-refresh mode signal, in this case a low, to node 213 when the output signal, SRENLATCH (self-refresh enable latch), of NAND gate 211 is high in order that the self-refresh mode is not exited by the self-refresh mode signal on 68A transitioning. At the termination of refresh SRENLATCH transitions low and disables a generation of the active SRCP*.

A 4K self-refresh cycle signal, a 2K self-refresh cycle signal, and a 1-K self-refresh cycle signal are available at counter output nodes 68B–D respectively and are multiplexed in a three to one multiplexer 215 which is controlled by two select input signals, SELA and SELB, which together determine whether the part is a 4K, 2K or 1K refresh part. The output of the multiplexer 215 is an input signal to pulse generator 220. In the present embodiment the pulse generator 220 provides a 15 nanosecond active SRCP* pulse at node 221 when enabled by a high SRENLATCH signal at the output of NAND gate 211. The SRCP* is active low. The SRCP* is an input to NAND gate 211. When the XRAS* is active, low, the output, SRENLATCH, of NAND gate 211 is high. Thus if XRAS* transitions high during the termination of the self-refresh cycle and the SRCP* is low the output signal, SRENLATCH, of NAND gate 211 remains high thereby locking out the transition of XRAS* until the SRCP* transitions high.

It is possible within the scope of the invention to use a pulse generator which generates pulses having pulse widths other than 15 nanoseconds.

On the other hand if the XRAS* signal transitions high when SRCP* is high, the NAND gate 211 output, SRENLATCH, goes low. The low SRENLATCH is fed back as an input to pulse generator 220. The low SRENLATCH disables pulse generator circuit 220 and SRCP* remains high thereby latching a high to node 213 allowing a glitch free exit from the self-refresh mode. Thus NAND gate 211 and the latch circuit 212 form a lock out circuit which locks out a transition in XRAS* or a transition of the SRCP* at the termination of the self-refresh mode.

The SRCP* at node 221 is delayed in delay circuit 222 to the input of NOR gate 225 which is enabled and disabled by the signal latched to node 213 by latch circuit 212. This delay ensures that the active SRCP* does not reach the NOR gate 225 before NOR gate 225 is properly enabled or disabled. This delay is particularly important in the case where the SRCP* begins to transition to an active state following the transition of the XRAS* to the inactive state. The SRCP* is delayed in delay circuit 222 in order to allow node 213 to transition high thereby disabling the NOR gate 225.

Multiplexer 227 in an output circuit portion 199 provides an internal RAS pulse at its output node 201. During the self-refresh mode the SRCP* on node 200 is multiplexed to the output by the active self-refresh mode signal on node 213 which is buffered to node 230 to function as a select input to multiplexer 227. When XRAS* transitions high and the SRCP* is high the latch drives the potential of node 213 to a high potential. The high potential on node 213 is buffered to node 230 where it selects XRAS* as the internal RAS output signal of multiplexer 227. Thus the invention prevents metastability during an exit from the self-refresh mode.

The apparatus in FIG. 3 also shows, by way of example, but not by way of limitation, a manner of implementing a method of operating a dynamic random access memory device, which method comprises the following steps: (a) generating a signal having a first pulse defining an active state and a second pulse defining an inactive state; (b) delaying a transition from the inactive state to the active state; (c) delaying a transition from the active state to the inactive state for a longer period of time than said step of delaying a transition from the inactive state to the active state; (d) sourcing current between a supply node and a signal generator in response to the active state of said signal; and (e) generating an internal clock signal in response to said step of sourcing.

The above described method can also include the additional step of adjusting a duty cycle equal to a ratio of a pulse width of the first pulse to a pulse width of the second pulse in response to temperature. Said method with said additional step of adjusting a duty cycle equal to a ratio of a pulse width of the first pulse to a pulse width of the second pulse can further comprise yet another additional step of increasing the duty cycle for a temperature increase. Said method with said additional step of adjusting a duty cycle equal to a ratio of a pulse width of the first pulse to a pulse width of the second pulse can further comprise still another additional step of decreasing the duty cycle for a temperature decrease.

Figure 4:
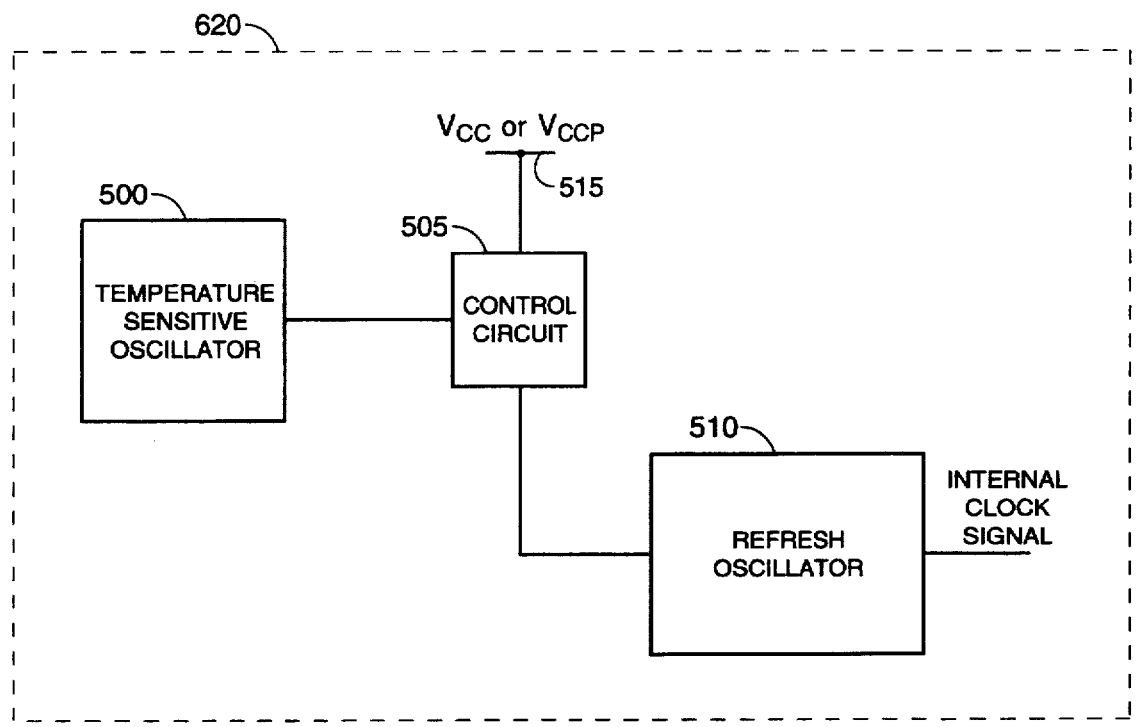
FIG. 4 is a block schematic of the temperature sensitive oscillator circuit, the refresh oscillator circuit, and the control circuit of the invention.

The invention is a temperature sensitive oscillator circuit 500 and control circuit 505, shown in block format in FIG. 4. The duty cycle of the output signal of the temperature sensitive oscillator circuit 500 is dependent on temperature, and the maximum value of the duty cycle is controlled by a feedback route, either feedback 506 or 507 (see FIG. 5). In the case where feedback route 507 is used the duty cycle may actually reach 100%, and in the case where feedback route 506 is used the duty cycle cannot reach 100%. The duty cycle increases for increases in temperature and decreases for decreases in temperature. The output signal of the temperature sensitive oscillator circuit controls the control circuit 505 which sources current between a refresh oscillator circuit 510 and a supply node 515. Therefore the temperature sensitive oscillator circuit and the control circuit may be thought of as a current source. The supply node 515 is connectable to a supply potential, such as Vcc or a pumped supply potential, Vccp. The control circuit 505 is activated in response to an active state of the output signal of the temperature sensitive oscillator circuit. As temperatures increase the pulse having the active state has a larger percentage increase in pulse width than does the pulse having the inactive state. The duty cycle is equal to the ratio of the pulse width of the pulse having the active state to the pulse width of the pulse having the inactive state. As the duty cycle of the output signal of the temperature oscillator sensitive circuit 500 increases, the time duration during which the control circuit 505 is activated increases. Since the control circuit 505 is actuated for a longer time in a given time period, more current sources in the given time period to charge a capacitor of the refresh oscillator circuit 510 more quickly, thereby increasing the frequency of the output signal of the refresh oscillator circuit 510. The output signal of the refresh oscillator circuit 510 is an internal clock signal for controlling a refresh rate of a memory device such as a dynamic random access memory (DRAM) device.

Thus by using the output signal of the temperature sensitive oscillator circuit 500 of the invention, it is no longer necessary to constantly activate a control circuit as was done in the circuit shown in FIG. 1. Instead a pulse of the temperature sensitive oscillator circuit 500 controls the activation of the control circuit 505. At lower temperatures the control circuit 505 is actuated less during a given time period thereby decreasing the frequency of the internal clock signal generated by the refresh oscillator circuit. The refresh rate required to maintain valid data in memory cells of a DRAM is less at lower temperatures since the memory cells of a DRAM lose less charge at lower temperatures. The temperature sensitive oscillator circuit 500 of the invention provides a temperature regulated refresh rate when used to control the refresh oscillator circuit 510. Power is therefore conserved since the part is only refreshed when needed rather than for the worst case. In addition power is conserved since the control circuit 505 is only actuated during one pulse width of the output signal of the temperature sensitive oscillator circuit 500 rather than constantly as was the case in the circuit of FIG. 1.

Figure 5:
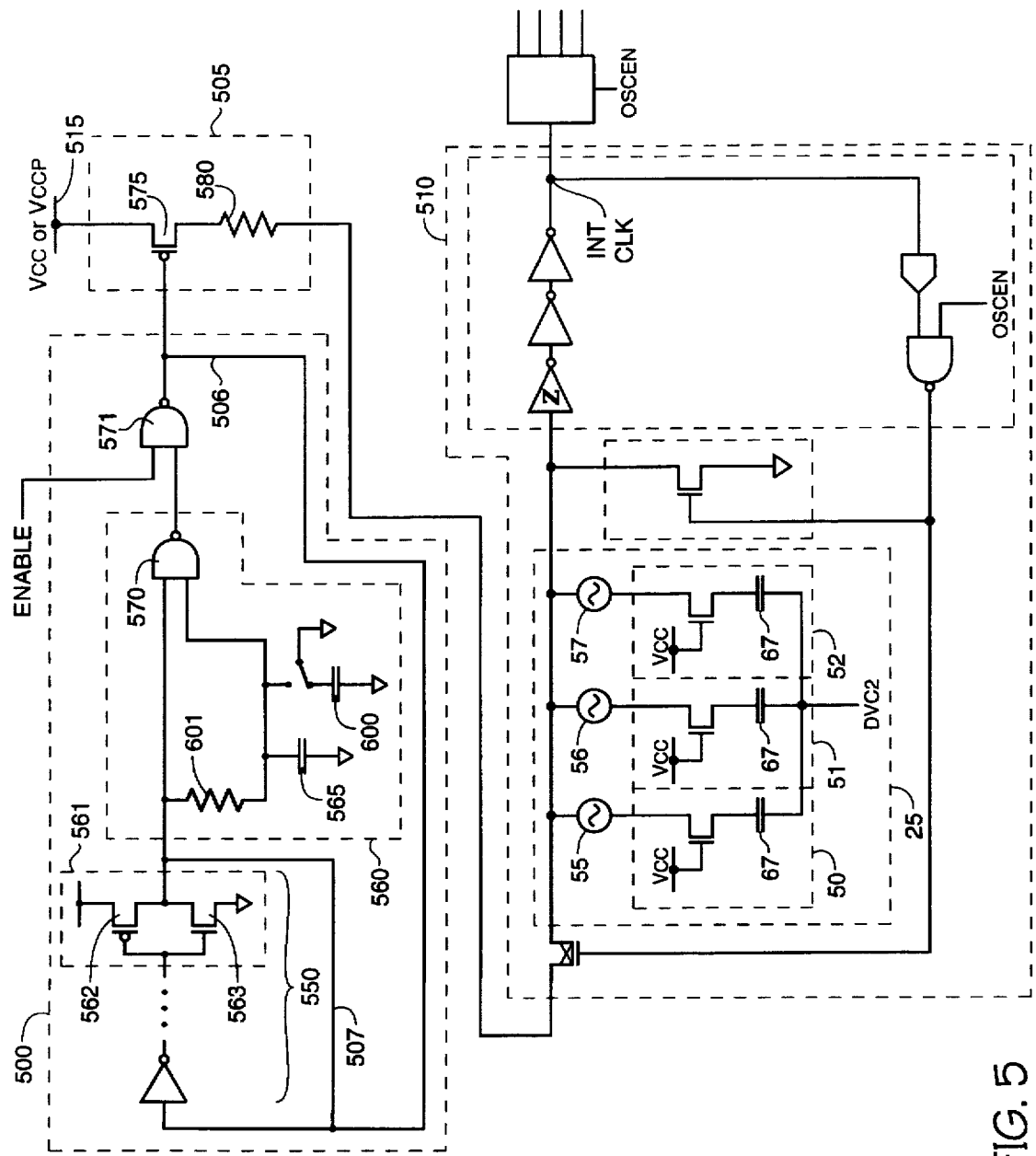
FIG. 5 is a more detailed schematic of the circuit of FIG. 4.

FIG. 5 is a detailed schematic of the circuit of FIG. 4. The temperature sensitive oscillator circuit 500 is a ring oscillator wherein the high logic pulse of the output signal of the temperature sensitive oscillator circuit is primarily determined by a signal delay through a string of lightly loaded inverters 550. The low logic pulse is primarily determined by one or more delay elements comprised of logic gates and capacitors which are represented by one delay element 560. The inverters 550 and the delay element 560 form a delay circuit. Over variations in temperature, the delay elements have shown significantly greater variations in speed than do inverters. Therefore, the output signal of the temperature sensitive oscillator circuit has a duty cycle that varies significantly over the operating temperature range of the DRAM.

A closer look at the delay circuit reveals that as the temperature increases, the current from the last inverter 561 (shown schematically) of the string of inverters 550 decreases. Inverter 561 is designed to have low current drive especially for low to high output transitions. This may be accomplished when inverter 561 is a CMOS configuration utilizing a PMOS pull up device 562 having a small channel width with a long channel length. An NMOS pull down device 563 of inverter 561 has high drive to limit the temperature sensitivity of the-high to low transition of the inverter 561 output. When the current decreases it takes a longer time to charge the capacitor 565. Thus the delay time for the output signal of NAND gate 570 to transition from a high to a low is greater at higher temperatures. The output of NAND gate 570 is inverted by NAND gate 571, when the NAND gate 571 is enabled, to generate the output signal of the temperature sensitive oscillator circuit 500. Thus at higher temperatures a pulse width of a low logic pulse of the output signal of the temperature sensitive oscillator circuit 500 increases disproportionately with respect to an increase in a pulse width of a high logic pulse. Thus, the delay circuit is polarity sensitive and the duty cycle of the low logic pulse to the high logic pulse increases at increased temperatures. The control circuit 505 is a PMOS transistor functioning as a switch 575 for refresh oscillator circuit 510. Thus at higher temperatures the switch 575 is actuated for a greater percentage of the period of the output signal of the temperature sensitive oscillator circuit 500 than at lower temperatures.

When the switch 575 is activated current sources between the refresh oscillator circuit 510 and the supply node 515. When the current sources, the capacitors 67 in the control arrays 50–52 are charged and the refresh oscillator circuit 510 generates an internal clock signal as explained in the explanation of FIG. 1. Although one refresh oscillator circuit 510 has been described other oscillator circuits may be used without departing from the spirit and scope of the invention.

Since the switch 575 is only actuated for a portion of the time determined by the duty cycle of the output signal of the temperature sensitive oscillator circuit, the total capacitance of the capacitor arrays 50–52 or the resistance of the resistor 580, in FIG. 5, can be smaller than in previous designs. The invention requires less power than previous designs since the current source is on intermittently rather than constantly.

It should also be noted that the enable input of NAND gate 571 allows the temperature sensitive oscillator to shut down when the part is not in a self-refresh mode or alternately to be activated when the oscillator is used in another operation mode. When feedback path 507 is used, the enable signal should disable one of the elements 550 to shut off the ring oscillator and force the output at oscillator 500 to an inactive state.

Since the duty cycle, rather than the frequency, of the output signal of the temperature sensitive oscillator circuit 500 determines the frequency of the internal clock signal, the frequency of the output signal of the temperature sensitive oscillator circuit 500 is not critical as long as it is significantly greater than the frequency of the internal clock signal. The frequency of the output signal of the temperature sensitive oscillator circuit 500 increases at lower temperatures as the delay induced by both the string of inverters and the string of delay elements decreases. The reverse is true for higher temperatures.

It should also be noted that inverters 550 may be fine tuned to control inverter output current in order to determine circuit sensitivity to temperature.

In addition the temperature sensitivity of the temperature sensitive oscillator circuit 500 can be easily controlled and fine tuned by providing optional inverters and delay elements. The temperature sensitivity can also be controlled through a variable capacitor or by circuitry which allows for the inclusion or omission of a further parallel capacitor such as capacitor 600 or by varying the resistance of resistor 601 (see FIG. 5). It is also possible to eliminate the temperature sensitivity obtained through the use of the temperature sensitive oscillator circuit 500 by grounding the gate of the control circuit 505 in the event that temperature compensated refresh is not desired.

When fine tuning it is possible to design a circuit of the invention for which the internal clock signal generated by the refresh oscillator circuit 510 remains constant over the range of operating temperatures. This is useful since the frequency of the internal clock signal generated by the refresh oscillator circuit 5 10 has a natural tendency to decrease as temperature increases, and vice versa, in a case where a current source is constantly activated. The circuit of FIG. 5 can be tuned to compensate for these frequency increases and decreases by controlling the duty cycle of the temperature sensitive oscillator circuit 500 over temperature.

The apparatus in FIG. 5 also shows, by way of example, but not by way of limitation, a manner of implementing a method of operating a method of operating a dynamic random access memory device, which method comprises the following steps: (a) inverting a signal to generate an inverted signal; (b) receiving the inverted signal on a first input of a logic circuit; (c) delaying the inverted signal to a second input of the logic circuit, said signal on the second input called a delayed signal, wherein a time period at which the delayed signal lags the inverted signal at the second and first inputs, respectively, is dependent on temperature; (d) actuating a current source in response to the inverted signal and the delayed signal; (e) charging a capacitor during a time said current source is actuated; and (f) generating an oscillator output signal in response to charge and discharge of the capacitor.

The above described method can also comprise an additional step of charging the capacitor more quickly at a first temperature that is greater than a second temperature. The method can further comprise an additional step of charging the capacitor more quickly at a first temperature that is lower than a second temperature.

Thus with the circuit and method of the invention is possible to design a part with a low power option while maintaining a slow self-refresh frequency at low temperatures. The part can be designed to have a low maximum operating temperature to ensure that the refresh frequency does not increase to the point of drawing excessive current.

Although one delay element 560 has been schematically described in this embodiment other types of delay elements may be used for the temperature sensitive oscillator circuit 500.

Figure 6:
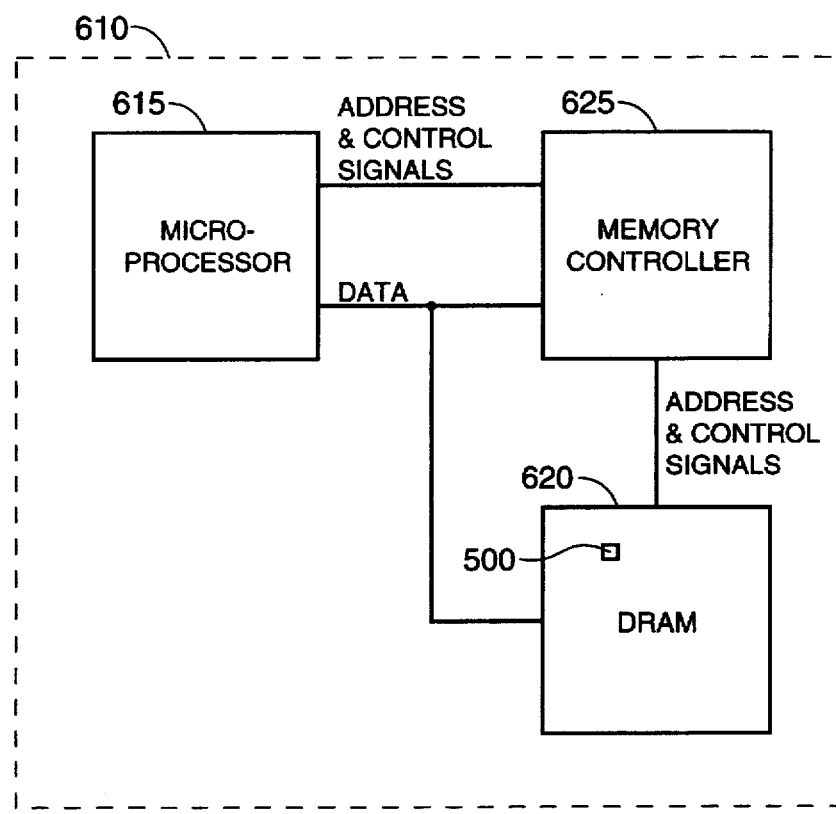
FIG. 6 is block schematic of a computer system of the invention.

The invention is also a computer system 610, as shown in FIG. 6, which stores memory data. The computer system 610 has a microprocessor 615 which provides an address and a read or write command. The microprocessor 615 routes the address and command to a memory chip 620 via a memory controller 625 and routes data to and from the memory chip 620. In this embodiment memory chip 620 is a DRAM having the temperature sensitive oscillator circuit 500, shown in FIGS. 4 and 5. The microprocessor causes the controller to enable a self refresh mode in the DRAM in response to a low power mode. Low power operation of the memory is especially important when the computer system is battery powered.

Although in the circuit and method of the invention, the current through the current source increases as temperature increases and vice versa, the reverse is true when the polarity of control circuit 575 is reversed or the delay circuit is redesigned to provide the opposite polarity to the gate of the control circuit 575. In this case, as the temperature increases the current decreases and vice versa.

While this invention has been described with reference to an illustrative embodiment, this description is not intended to be construed in a limiting sense. Various modifications as well as other embodiments will be apparent to persons skilled in the art upon reference to this description. It is, therefore contemplated that the appended claims cover any such modifications or embodiments as fall within the true scope of the invention.

What is claimed is:

1. A method of operating a dynamic random access memory device comprising the following steps:
    (a) generating a periodic signal within the dynamic random access memory device;
    (b) delaying a transition of said periodic signal to provide a delay signal having an active state and an inactive state; and
    (c) sourcing current from a current supply in response to one of the active or inactive states of the delay signal.

2. The method as specified in claim 1, further comprising controlling a duty cycle of the delay signal.

3. The method as specified in claim 2, further comprising the step of altering the duty cycle in response to a temperature change.

4. A method of operating a dynamic random access memory device, comprising the following steps:
    (a) generating a periodic signal within the memory device;
    (b) delaying a transition of said periodic signal to provide a delay signal having an active state and an inactive state, wherein a ratio of a pulse width of a pulse of the delay signal having the active state to a pulse width of a pulse of the delay signal having the inactive state is temperature dependent; and
    (c) sourcing current from a current supply in response to the active state of the delay signal.

5. A method of operating a dynamic random access memory device, comprising the following steps:
    (a) internally providing a periodic signal having a duty cycle variable relative to temperature; and
    (b) sourcing current between a supply node and an oscillator in response to said periodic signal, wherein an amount of current sourced in each period of the periodic signal varies relative to said duty cycle.

6. The method as specified in claim 5 further comprising the step of increasing a frequency of an oscillator output signal in response to a temperature decrease.

7. The method as specified in claim 5 further comprising the step of decreasing a frequency of an oscillator output signal in response to a temperature increase.

8. A method of operating a dynamic random access memory device, comprising the following steps:
    a) generating a signal having a first pulse defining an active state and a second pulse defining an inactive state;
    b) delaying a transition from the inactive state to the active state;
    c) delaying a transition from the active state to the inactive state for a longer period of time than said step of delaying a transition from the inactive state to the active state;
    d) sourcing current between a supply node and a signal generator in response to the active state of said signal; and
    e) generating an internal clock signal in response to said step of sourcing.

9. The method as specified in claim 8, comprising adjusting a duty cycle equal to a ratio of a pulse width of the first pulse to a pulse width of the second pulse in response to temperature.

10. The method as specified in claim 9, further comprising increasing the duty cycle for a temperature increase.

11. The method as specified in claim 9, further comprising decreasing the duty cycle for a temperature decrease.

12. A method of operating a dynamic random access memory device, comprising the following steps:
    a) inverting a signal to generate an inverted signal;
    b) receiving the inverted signal on a first input of a logic circuit;
    c) delaying the inverted signal to a second input of the logic circuit, said signal on the second input called a delayed signal, wherein a time period at which the delayed signal lags the inverted signal at the second and first inputs, respectively, is dependent on temperature;
    d) actuating a current source in response to the inverted signal and the delayed signal;
    e) charging a capacitor during a time said current source is actuated; and
    f) generating an oscillator output signal in response to charge and discharge of the capacitor.

13. The method as specified in claim 12, further comprising charging said capacitor more quickly at a first temperature which is greater than a second temperature.

14. The method as specified in claim 12, further comprising charging said capacitor more quickly at a first temperature which is less than a second temperature.

* * * * *